United States Patent
Yamaoka et al.

(10) Patent No.: US 8,093,543 B2
(45) Date of Patent: *Jan. 10, 2012

(54) VOLTAGE GENERATOR CIRCUIT HAVING A RESISTOR LADDER CIRCUIT AND A SWITCH CONTROL CIRCUIT ALLOWING A VARIATION OF THE SLOPE OF A GIVEN RAMP WAVE, DIGITAL-TO-ANALOG CONVERTER, RAMP GENERATOR CIRCUIT, ANALOG-TO-DIGITAL CONVERTER, IMAGE SENSOR SYSTEM, AND METHOD FOR GENERATING VOLTAGE

(75) Inventors: Yuusuke Yamaoka, Osaka (JP); Kazuko Nishimura, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/012,600

(22) Filed: Jan. 24, 2011

(65) Prior Publication Data

US 2011/0114827 A1 May 19, 2011

Related U.S. Application Data

(63) Continuation of application No. PCT/JP2010/002783, filed on Apr. 16, 2010.

(30) Foreign Application Priority Data

Aug. 18, 2009 (JP) .................................. 2009-189342

(51) Int. Cl.
*H01J 40/14* (2006.01)
(52) U.S. Cl. .............................. 250/214 R; 250/214 SW
(58) Field of Classification Search ............... 250/214 R, 250/214 RC, 214 SW, 208.1; 341/118–159; 327/514, 530–540
See application file for complete search history.

(56) References Cited

U.S. PATENT DOCUMENTS

| | | | |
|---|---|---|---|
| 6,064,327 A * | 5/2000 | Ryoho et al. | .................. 341/154 |
| 6,590,514 B2 | 7/2003 | Suzuki | |
| 6,956,413 B2 | 10/2005 | Bailey | |
| 7,767,953 B2 * | 8/2010 | Yamaoka | .................. 250/214 R |
| 2002/0158787 A1 | 10/2002 | Suzuki | |
| 2007/0194962 A1 | 8/2007 | Asayama et al. | |
| 2008/0296473 A1 | 12/2008 | Yamaoka | |

FOREIGN PATENT DOCUMENTS

| | | |
|---|---|---|
| JP | 11-205149 | 7/1999 |
| JP | 2002-325040 | 11/2002 |
| JP | 2007-059991 | 3/2007 |
| JP | 2008-299716 | 12/2008 |

* cited by examiner

*Primary Examiner* — Que T Le
(74) *Attorney, Agent, or Firm* — McDermott Will & Emery LLP

(57) ABSTRACT

A resistor-ladder voltage generator circuit is provided, which controls so that k switches among consecutive (k+1) switches out of a plurality of switches connected to the resistor ladder circuit are simultaneously set to an ON state, and which temporally switches the value of k. This allows voltage waveforms having different slopes to be arbitrarily obtained, ranging from a voltage waveform having a small slope to a voltage waveform having a large slope, thereby improving the resolution of a generated voltage waveform without increasing the numbers of resistors and switches, while A/D conversion time is not increased even if the number of bits is increased. In addition, by using this voltage generator circuit as a ramp generator circuit, and by dynamically switching the slope of the ramp wave, acceleration of an image sensor is achieved.

10 Claims, 15 Drawing Sheets

FIG. 2

| SW6 | Off | Off | Off | Off | Off | On |
|-----|-----|-----|-----|-----|-----|-----|
| SW5 | Off | On | On | On | On | Off |
| SW4 | On | Off | On | On | On | On |
| SW3 | On | On | Off | On | On | On |
| SW2 | On | On | On | Off | On | On |
| SW1 | On | On | On | On | Off | Off |

| SW6 | Off | Off | Off | On | On |
|-----|-----|-----|-----|-----|-----|
| SW5 | Off | On | On | On | On |
| SW4 | On | On | On | Off | On |
| SW3 | On | Off | On | On | On |
| SW2 | On | On | On | On | Off |
| SW1 | On | On | Off | Off | Off |

| SW6 | Off | Off | Off | Off | Off |
|-----|-----|-----|-----|-----|-----|
| SW5 | Off | Off | Off | Off | Off |
| SW4 | Off | Off | Off | On | On |
| SW3 | Off | On | On | Off | On |
| SW2 | On | Off | On | On | Off |
| SW1 | On | On | Off | Off | Off |

| SW8 | Off | Off | Off | Off | On  |
|-----|-----|-----|-----|-----|-----|
| SW7 | Off | Off | Off | On  | On  |
| SW6 | Off | Off | On  | On  | On  |
| SW5 | Off | On  | On  | On  | On  |
| SW4 | On  | On  | On  | On  | Off |
| SW3 | On  | On  | On  | Off | Off |
| SW2 | On  | On  | Off | Off | Off |
| SW1 | On  | Off | Off | Off | Off |

| SW8 | Off | Off | Off | Off | Off |
|-----|-----|-----|-----|-----|-----|
| SW7 | Off | Off | Off | Off | Off |
| SW6 | Off | Off | Off | Off | Off |
| SW5 | Off | Off | Off | Off | On  |
| SW4 | Off | Off | Off | On  | Off |
| SW3 | Off | Off | On  | Off | Off |
| SW2 | Off | On  | Off | Off | Off |
| SW1 | On  | Off | Off | Off | Off |

| | | | |
|---|---|---|---|
| SW9 | Off | Off | Off |
| SW8 | Off | Off | On |
| SW7 | Off | Off | On |
| SW6 | Off | On | On |
| SW5 | Off | On | On |
| SW4 | On | On | Off |
| SW3 | On | On | Off |
| SW2 | On | Off | Off |
| SW1 | On | Off | Off |

| | | | |
|---|---|---|---|
| SW9 | Off | Off | Off |
| SW8 | Off | Off | Off |
| SW7 | Off | Off | Off |
| SW6 | Off | Off | Off |
| SW5 | Off | Off | On |
| SW4 | Off | Off | Off |
| SW3 | Off | On | Off |
| SW2 | Off | Off | Off |
| SW1 | On | Off | Off |

. . . .

VOLTAGE GENERATOR CIRCUIT HAVING A RESISTOR LADDER CIRCUIT AND A SWITCH CONTROL CIRCUIT ALLOWING A VARIATION OF THE SLOPE OF A GIVEN RAMP WAVE, DIGITAL-TO-ANALOG CONVERTER, RAMP GENERATOR CIRCUIT, ANALOG-TO-DIGITAL CONVERTER, IMAGE SENSOR SYSTEM, AND METHOD FOR GENERATING VOLTAGE

CROSS-REFERENCE TO RELATED APPLICATION

This is a continuation of PCT International Application PCT/JP2010/002783 filed on Apr. 16, 2010, which claims priority to Japanese Patent Application No. 2009-189342 filed on Aug. 18, 2009. The disclosures of these applications including the specifications, the drawings, and the claims are hereby incorporated by reference in its entirety.

BACKGROUND

The present invention relates to voltage generator circuits, particularly to ramp generator circuits, and more particularly to configurations for allowing a wider variable range of the slope of a ramp wave and to configurations for higher-speed operations in image sensors which perform simultaneous parallel analog-to-digital (A/D) conversion.

Conventionally, an A/D conversion technology using a ramp wave whose waveform changes in a stepwise manner can convert simultaneously, and in parallel, a multitude of analog signals into digital signals. Therefore, attention has been given to such technology as a way of achieving higher-speed operations in a system, such as an image sensor, in which a multitude of pixel signals need to be converted into digital signals.

In this technology, A/D conversion is performed by comparing analog signals provided from individual pixels to a plurality of comparators with a ramp wave, as a reference signal, commonly provided to the respective comparators. In order to support analog signals from pixels having brightness ranging from low brightness to high brightness, a ramp generator circuit having a broad variable slope range is required.

Conventionally, technologies such as those described in Patent Documents 1 and 2 have been known, which change the slope of a ramp wave in a resistor-ladder ramp generator circuit by changing a voltage V applied across the both ends of the resistor ladder circuit as shown in FIG. 19, or by changing a current I flowing through the resistor ladder circuit as shown in FIG. 20.

PATENT DOCUMENT 1: Japanese Patent Publication No. 2008-299716
PATENT DOCUMENT 2: U.S. Pat. No. 6,956,413

SUMMARY

However, a configuration in which the value of a voltage applied across the both ends of a resistor ladder circuit is changed as shown in FIG. 19, or a configuration in which the value of a current flowing through a resistor ladder circuit is changed as shown in FIG. 20, does not allow a voltage higher than the supply voltage or that corresponding to the supply current to be applied across the both ends of the resistor ladder circuit. Accordingly, increasing the slope of a ramp wave has a limitation, and thus such configurations are disadvantageous in that the slope of a ramp wave cannot be made greater than a particular value.

In addition, A/D conversion requires technology in which increasing the number of bits does not cause A/D conversion time to be increased. However, conventionally, a larger number of bits require a longer time for a ramp wave to reach a supply voltage value from a zero value across the full-scale range, and thus the above configurations are also disadvantageous in that A/D conversion time increases.

In view of the foregoing disadvantages, it is an object of the present invention to allow the slope of a ramp wave etc. to be set higher than a conventional value while improving the resolution of a voltage waveform of the ramp wave etc. and securing a high accuracy of A/D conversion without increasing the numbers of resistors and switches, and thus to prevent A/D conversion time from increasing even if the number of bits is increased, in a voltage generator circuit such as a resistor-ladder ramp generator circuit.

In order to achieve the above object, the present invention utilizes, in a voltage generator circuit such as a resistor-ladder ramp generator circuit, a configuration which provides control so that a plurality of switches among all the switches provided are simultaneously set to an ON state, and which changes as appropriate the number of the plurality of switches which are simultaneously set to an ON state. Thus, a combined resistance value selected by the resistor ladder circuit is finely adjusted, thereby improving the resolution of the voltage waveform of the ramp wave etc., and each reference voltage is finely controlled.

More specifically, a voltage generator circuit of the present invention includes a resistor ladder circuit configured to receive a predetermined voltage or a predetermined current, and to generate a plurality of reference voltages different from one another, a plurality of switches corresponding to a plurality of taps of the resistor ladder circuit, each of which has one end connected to the tap corresponding thereto and the other end connected to an output node, and a switch control circuit configured to control on-off states of the plurality of switches so that k (k is an integer greater than or equal to one) switches among consecutive (k+1) switches out of the plurality of switches are set to an ON state, and capable of switching the value of k.

A digital-to-analog (D/A) converter of the present invention includes the voltage generator circuit, where the switch control circuit receives a digital code and controls the on-off states of the plurality of switches according to the digital input code, and an analog voltage output is obtained from the output node.

A ramp generator circuit of the present invention is a ramp generator circuit including the voltage generator circuit, where the switch control circuit of the voltage generator circuit switches the on-off states of the plurality of switches according to a predetermined timing signal, and a ramp-wave output is obtained the output node.

An A/D converter of the present invention includes a reference signal generation section configured to generate a reference signal for converting analog signals into digital signals, a comparison section configured to compare the analog signals with the reference signal, a counter section configured to perform a counting operation in parallel with a comparison operation in the comparison section, and to hold a count value when the output of the comparison section is inverted, in order to obtain digital signals corresponding to the analog signals, and a correction section configured to correct an output from the counter section, where the reference signal generation section includes the ramp generator circuit, switches the value of k, and sets the slope of the reference signal in multiple stages according to the magnitude of the reference signal, and the correction section corrects the output of the counter section according to the slope of the reference signal.

In an embodiment of the present invention, in the A/D converter, the correction section includes a delay measurement section configured to measure a delay from when the reference signal is output from the reference signal generation section until the reference signal is input to the comparison section, and to feed back the measured delay to the correction to the output of the counter section.

An image sensor system of the present invention includes a pixel section, in which a plurality of pixels each having a light receiving element which outputs a signal depending on the amount of incident light are arranged in a two-dimensional matrix, a vertical scan circuit configured to sequentially select pixels from the pixels on a line-by-line basis, the A/D converter for converting an analog signal from each of the pixels to a digital signal, a horizontal scan circuit configured to sequentially select an output of the A/D converter on a column-by-column basis, and a communication timing control section configured to generate clock signals and control signals, and to control at least the A/D converter.

In an embodiment of the present invention, in the image sensor system, the delay measurement section of the A/D converter measures a time for a ramp wave generated in the ramp generator circuit to reach a preset reference voltage, and calculates the delay by comparing the measured time with a reference time, during a predetermined initialization period.

In an embodiment of the present invention, in the image sensor system, the time measurement by the delay measurement section is performed on each column of the pixel section, multiple times in total, and the times measured for the respective columns are averaged to obtain the delay.

In an embodiment of the present invention, in the image sensor system, the time measurement by the delay measurement section is performed for all the columns of the pixel section at one time, and the times measured for all the columns are averaged to obtain the delay.

A method for generating a voltage of the present invention is a method for generating a voltage in a voltage generator circuit which includes a resistor ladder circuit configured to generate a plurality of reference voltages different from one another, and a plurality of switches corresponding to a plurality of taps of the resistor ladder circuit, each of which has one end connected to the tap corresponding thereto and the other end connected to an output node, where on-off states of the plurality of switches are controlled so that k (k is an integer greater than or equal to one) switches among consecutive (k+1) switches out of the plurality of switches are set to an ON state, and the value of k is sequentially switched.

Thus, the present invention allows a switch control circuit to control so that k (k is an integer greater than or equal to one) switches out of consecutive (k+1) switches are set to an ON state. Therefore, the resolution of the voltage waveform of the ramp wave etc. is improved, and a required accuracy of A/D conversion is secured without increasing the numbers of resistors and switches. Moreover, changing the value of k by the switch control circuit as appropriate allows the slope of a voltage waveform of a generated ramp wave etc. to be arbitrarily changed to a larger value to prevent increase of the A/D conversion time even if the number of bits is increased.

As described above, according to the present invention, the slope of a voltage waveform of a generated ramp wave etc. can be arbitrarily changed to a larger value, while securing a required accuracy of A/D conversion without increasing the numbers of resistors and switches of the resistor ladder circuit. As such, the present invention is advantageous in that increase of the A/D conversion time is prevented even if the number of bits is increased.

BRIEF DESCRIPTION OF THE DRAWINGS

FIG. 2 is a diagram illustrating a first control method of the switches of the resistor ladder circuit by the voltage generator circuit.

FIG. 3 is a diagram illustrating a second control method of the switches of the resistor ladder circuit.

FIG. 4 is a diagram illustrating a third control method of the switches of the resistor ladder circuit.

FIG. 5 is a diagram illustrating a fourth control method of the switches of the resistor ladder circuit.

FIG. 6 is a diagram illustrating a fifth control method of the switches of the resistor ladder circuit.

FIG. 7 is a diagram illustrating a sixth control method of the switches of the resistor ladder circuit.

FIG. 8 is a diagram illustrating a seventh control method of the switches of the resistor ladder circuit.

DETAILED DESCRIPTION

Example embodiments of the present invention will be described below in detail with reference to the drawings.

First Embodiment

Figure 1:
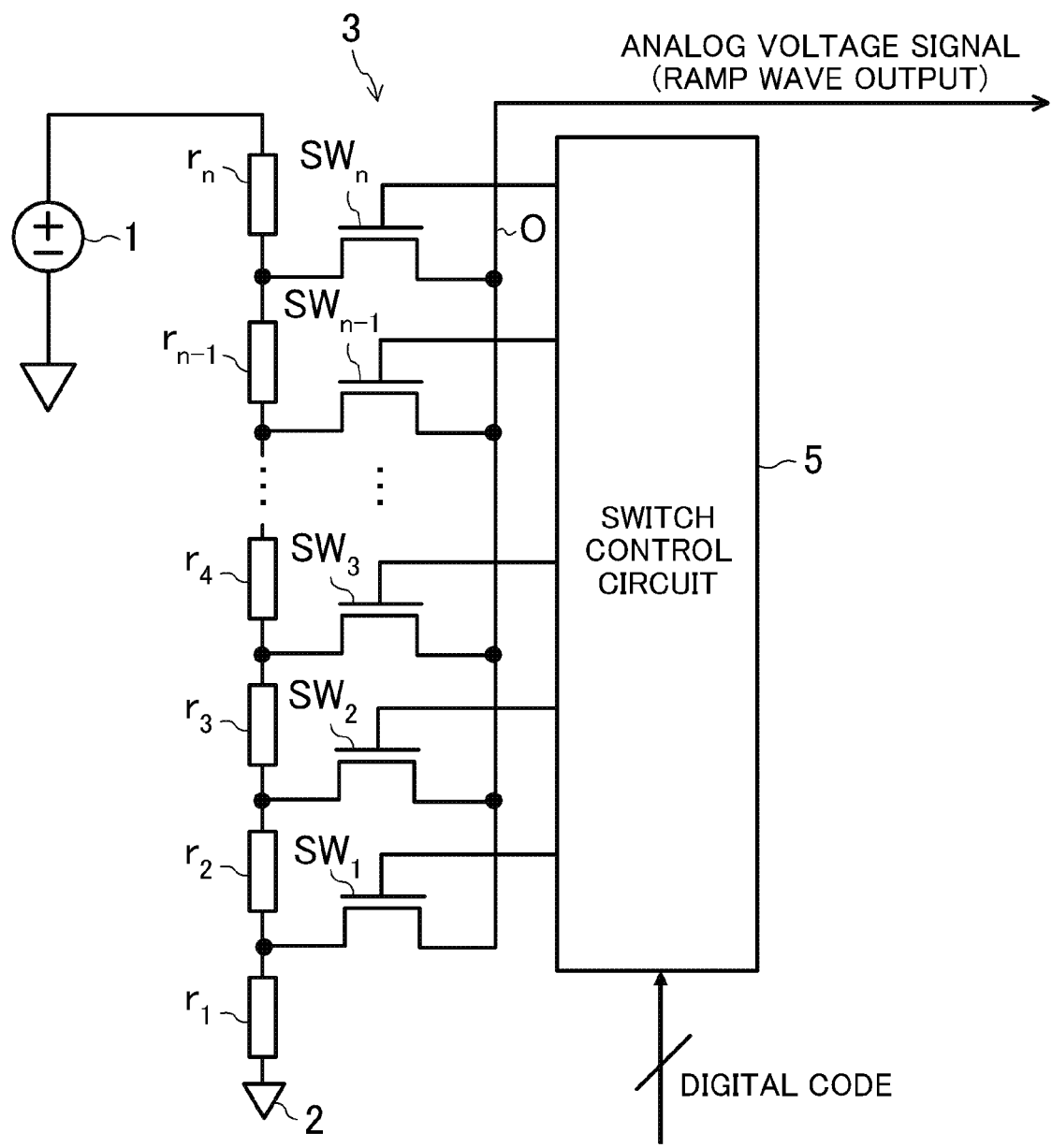
FIG. 1 is a diagram illustrating an entire configuration of a voltage generator circuit according to the first embodiment of the present invention.

FIG. 1 illustrates an entire configuration of a resistor-ladder voltage generator circuit according to the first embodiment of the present invention.

Figure 20:
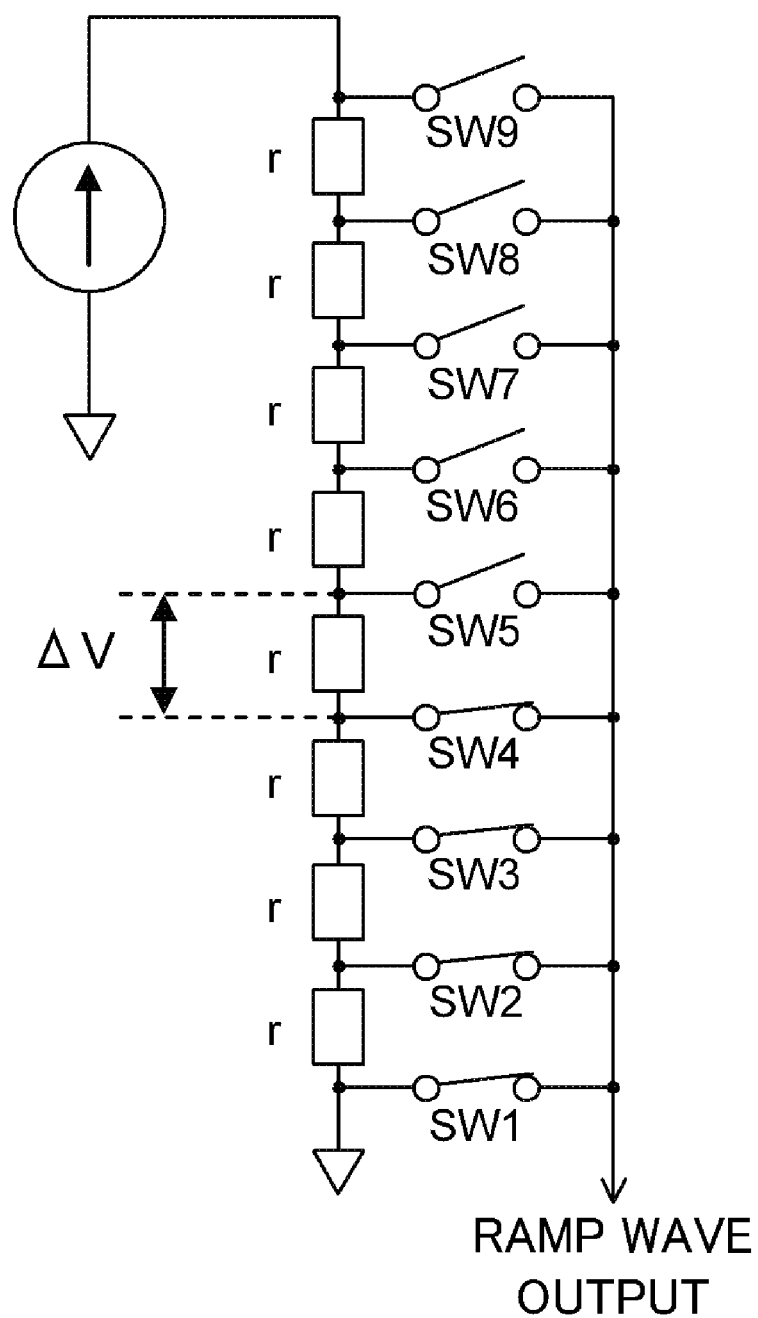
FIG. 20 is a diagram illustrating another conventional resistor-ladder voltage generator circuit.

In this figure, a multitude of resistors (n resistors in the figure) r1-rn are arranged in series between a power supply 1 and a ground terminal 2, forming a resistor ladder circuit 3. The connection points (taps) between the resistors are each connected to one end of each of switches SW1-SWn, which are formed of transistors. The other ends of these switches are connected together to form an output node O. A generated voltage signal is output to the outside world from the output node O. Note that the power supply 1 may be a constant current source as shown in FIG. 20.

The plurality of switches SW1-SWn are controlled by a switch control circuit 5. The switch control circuit 5 receives a digital code from the outside world, applies a control voltage to each control terminal of the plurality of switches SW1-SWn based on the digital code to provide on-off control, and outputs from the output node O an analog voltage signal depending on the digital code to the outside world. Thus, this voltage generator circuit functions as a digital-to-analog (D/A) converter. The on-off control of the switches SW1-SWn is provided such that k (k is an integer greater than or equal to one) switches out of the all (n) switches are simultaneously set to an ON state in order to improve the resolution of a voltage waveform generated by the resistors r1-rn and the switches SW1-SWn. How the on-off control is provided is illustrated, for example, in FIGS. 2-8. In FIGS. 2-8, the control states of the switches are transitioned based on a predetermined timing signal such as a clock signal.

Figure 9:
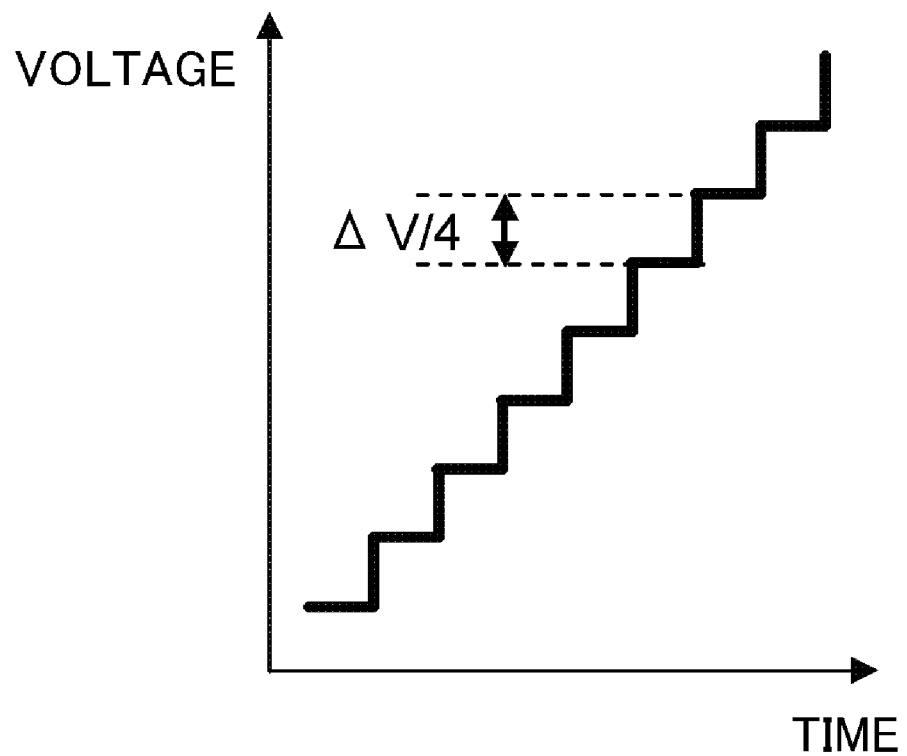
FIG. 9 is a diagram illustrating the appearance of a ramp wave generated by the first control method shown in FIG. 2.

FIGS. 2-8 illustrate the control states of the plurality of switches when the voltage generator circuit functions as a ramp generator circuit and the voltage waveform output from the output node O is a ramp wave. As shown in FIG. 2, if a control in which four (k=4) out of five (k+1) (k=4) consecutive switches are simultaneously set to an ON state is repeated so that the control states change by one stage every clock cycle of the clock signal, then as shown in FIG. 9, a ramp wave is obtained with a resolution of $\Delta V/4$, which is four times as high as the resolution $\Delta V$ when the switches SW1-SWn are set to an ON state one at a time and by one stage. In addition, as shown in FIG. 3, if a control in which four (k=4) out of five (k+1) (k=4) consecutive switches are simultaneously set to an ON state is repeated so that the control states change by two stages every clock cycle of the clock signal, then a ramp wave is obtained with a slope of $\Delta V/2$, which is twice as large as that of FIG. 2, without changing the voltage of the power supply 1 applied to the resistor ladder circuit 3. Moreover, as shown in FIG. 4, if a control in which two (k=2) out of three (k+1) (k=2) consecutive switches are simultaneously set to an ON state is repeated so that the control states change by one stage every clock cycle of the clock signal, then a ramp wave is obtained with a slope of $\Delta V/2$, which is twice as large as that of FIG. 2, without changing the voltage of the power supply 1 applied to the resistor ladder circuit 3. Similarly, as shown in FIG. 5, four (k=4) out of five (k+1) (k=4) consecutive switches are simultaneously set to an ON state is repeated so that the control states change by four stages every clock cycle of the clock signal, then a ramp wave is obtained with a slope of $\Delta V$, which is four times as large as that of FIG. 2; and as shown in FIG. 6, one (k=1) out of two (k+1) (k=1) consecutive switches is set to an ON state is repeated so that the control states change by one stage every clock cycle of the clock signal, then a ramp wave is obtained with a slope of $\Delta V$, which is four times as large as that of FIG. 2. Furthermore, as shown in FIG. 7, four (k=4) out of five (k+1) (k=4) consecutive switches are set to an ON state is repeated so that the control states change by four stages every clock cycle of the clock signal, then a ramp wave is obtained with a slope of $2 \cdot \Delta V$, which is eight times as large as that of FIG. 2; and as shown in FIG. 8, one (k=1) out of two (k+1) (k=1) consecutive switches is set to an ON state is repeated so that the control states change by two stages every clock cycle of the clock signal, then a ramp wave is obtained with a slope of $2 \cdot \Delta V$, which is eight times as large as that of FIG. 2.

Figure 10:
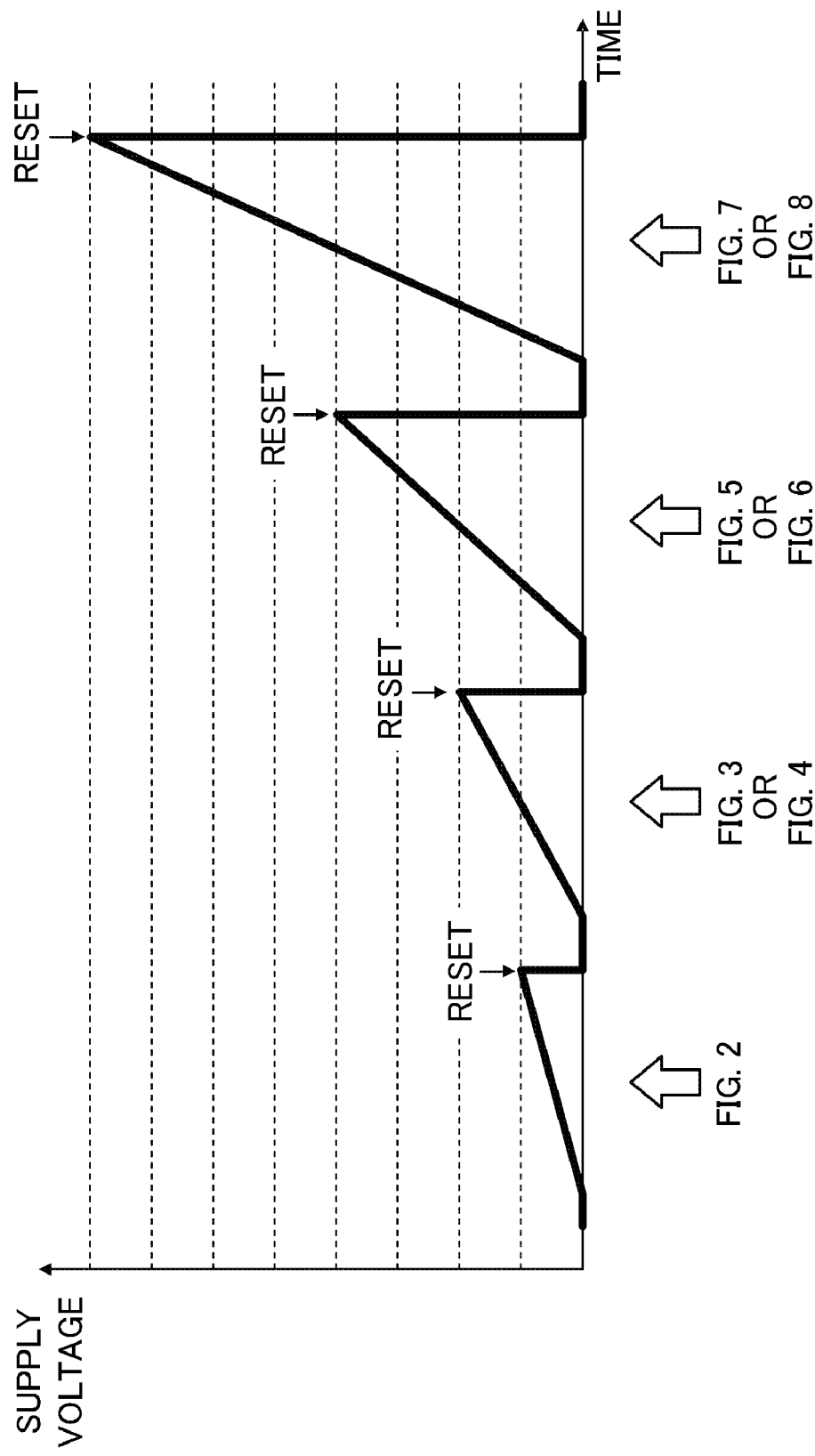
FIG. 10 is a diagram illustrating the appearance of ramp waves generated by the first through seventh control methods.

Accordingly, as shown in FIG. 10, assuming that the voltage of the power supply 1 has a fixed value, the switch control method of FIG. 2 can be used in a region requiring a high accuracy for digital data after A/D conversion because the resolution of $\Delta V/4$ can be obtained in the case of FIG. 2, which is four times as high as the slope $\Delta V$ of the ramp wave when the switches SW1-SWn are set to an ON state one at a time, while if the switch control methods of FIGS. 3-8 are used, A/D conversion time can be reduced in a region not requiring a high accuracy because the slope of the ramp wave can be twice, four times, or eight times as large as that of the FIG. 2 as shown in FIGS. 3-8.

Second Embodiment

Next, an image sensor system will be described below, which maintains required accuracy for converted data and, at the same time, can be designed to achieve reduction in A/D conversion time by changing the slope (gain) of a reference ramp signal in multiple stages using the above-described ramp generator circuit.

Figure 11:
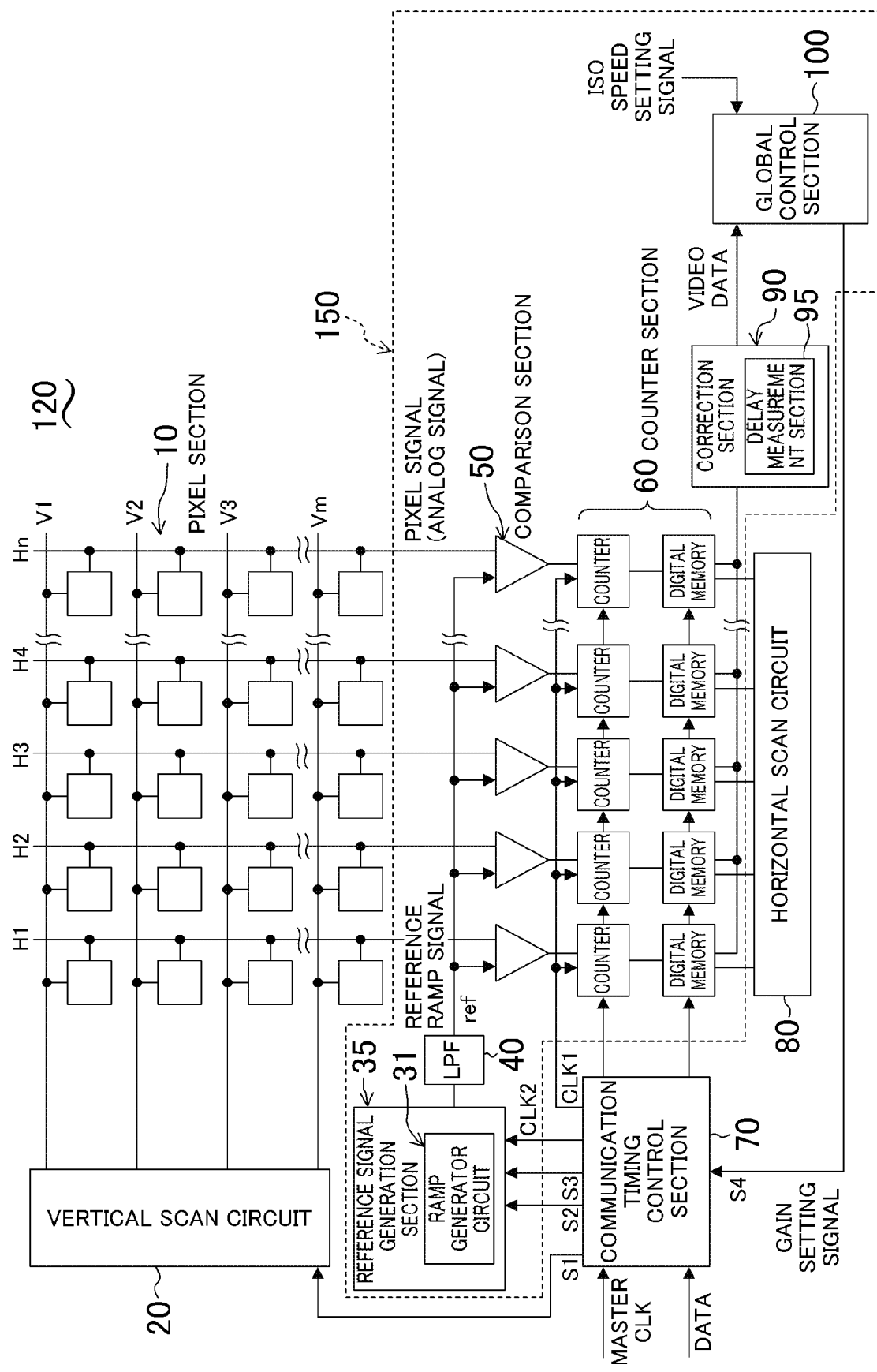
FIG. 11 is a diagram illustrating an entire configuration of an image sensor system according to the second embodiment of the present invention.

FIG. 11 illustrates an entire configuration of an image sensor system according to the second embodiment of the present invention.

The image sensor system 120 shown in FIG. 11 includes a pixel section 10, in which a plurality of pixels are arranged in a two-dimensional matrix. Each pixel in the pixel section 10 includes a light receiving element which outputs a signal depending on the amount of incident light. The image sensor system 120 also includes a vertical scan circuit 20 for selecting pixels on a line-by-line basis, a horizontal scan circuit 80 for selecting pixels on a column-by-column basis, a communication timing control section 70 which controls clock signals and control signals supplied to the respective circuits described above, and an A/D converter 150 which converts pixel signals (analog signals) from the pixels selected by the vertical scan circuit 20 on a line-by-line basis into digital signals.

The A/D converter 150 includes a reference signal generation section 35, which includes a switch control circuit 5 as a ramp generator circuit 31, having the configuration shown in FIG. 1, a low-pass filter 40 connected to the output of the ramp generator circuit 31, a comparison section 50 which includes a plurality of comparators provided in respective columns, a counter section 60 which includes counters and digital memories provided in respective columns, a correction section 90 which corrects the outputs from the counter section 60, and a global control section 100. The global control section 100 receives a corrected digital video signal from the correction section 90, and an ISO speed setting signal, generates a gain setting signal S4 which sets the slope of the ramp wave generated by the ramp generator circuit 31, and transfers the gain setting signal S4 to the communication timing control section 70.

The plurality of pixels in the pixel section 10 photoelectrically convert video data of an object into electrical signals, and output pixel signals (analog signals) according to the amount of incident light to the comparison section 50 in the A/D converter 150. The reference signal generation section 35 generates a reference ramp signal "ref," which gradually changes in a stepwise manner, by controlling the ramp generator circuit 31 with a ramp clock signal CLK2 from the communication timing control section 70, and then inputs the reference ramp signal ref to each comparator in the comparison section 50. Each of the comparators, provided in respective columns of the comparison section 50, compares in each column the analog signals output from the pixels with the reference ramp signal ref generated in the reference signal generation section 35. Each of the counters, provided in respective columns of the counter section 60 and corresponding to the respective comparators in the comparison section 50, performs a counting operation in synchronization with a counter clock signal CLK1 from the communication timing control section 70 in parallel with the comparison operation in each comparator, and then stores a count value when the output of the corresponding comparator is inverted into the corresponding digital memory. Thus, digital signals corresponding to analog signals from the pixels are obtained. The correction section 90 corrects the digital signals stored in the digital memories to be optimum data for video. According to the configuration described above, an analog signal of video of an object is converted into a digital signal representing a brightness value.

The ramp clock signal CLK2, which is input to the ramp generator circuit 31, and the counter clock signal CLK1, which is input to each counter of the counter section 60, are in a synchronous design, and are set so that a change of the reference ramp signal ref and a counting operation always occur simultaneously or at a divided frequency.

Here, an optical shot noise occurring at the time of photoelectric conversion in each pixel in the pixel section 10 varies with the square root of the optical signal S as expressed by $\sqrt{S}$. Therefore, when imaging a dark subject under low input-light conditions, the amount of optical shot noise is small, and thus the optical signals can be converted from analog to digital with high accuracy by A/D conversion with a high resolution. Meanwhile, when imaging a bright subject under high input-light conditions, the amount of optical shot noise is large, thus quantization errors at or below a predetermined level are not detectable due to optical shot noise. Accordingly, in such a case, even if the A/D conversion is performed at high resolution, A/D conversion cannot be performed at high resolution for optical signals. This indicates that, in a region where the intensity of an optical signal is high enough to cause a large optical shot noise, resolution at or below the optical shot noise level is sufficient, and a reduced resolution of A/D conversion within that range causes no change in terms of accuracy as a result of A/D conversion. That is, adjusting the quantization step size using the foregoing allows A/D conversion to be accelerated as a whole.

More specifically, when imaging a dark subject under low input-light conditions, digital data is obtained with the gain of an imaging signal in high gain to ensure a sufficient dynamic range. Meanwhile, when imaging a bright subject under high input-light conditions, the gain of an imaging signal is kept in low gain within the range where quantization errors are at or below the optical shot noise level, and digital data is obtained in this situation. This allows the comparison time in the comparison section 50 and the counting time in the counter section 60 to be reduced, while maintaining a required accuracy for video data. To this end, the global control section 100 generates either a gain setting signal S4 which sets an optimum gain of the reference ramp signal ref in the ramp generator circuit 31 based on the corrected digital video signal from the correction section 90, or a gain setting signal S4 which sets a gain of the reference ramp signal ref based on the ISO speed setting signal received. For example, the gain setting signal S4 sequentially changes the switch control method of the switches SW1-SWn from that of FIG. 2 through that of FIG. 3 or 4 and that of FIG. 5 or 6, to that of FIG. 7 or 8, as the brightness value included in the digital video signal from the correction section 90 increases.

As a specific example, one example of controlling the slope (gain) of the reference ramp signal ref in the ramp generator circuit 31 based on the gain setting signal S4 from the global control section 100 will be described below with reference to FIG. 12. In this embodiment, in order to achieve reduction in comparison time while maintaining required accuracy for video data, the slope (gain) of the reference ramp signal ref is sequentially changed to $2^0$ times, $2^1$ times, $2^2$ times, ... larger at timings when quantization errors are at or below the optical shot noise level. The description will be given below.

Figure 12:
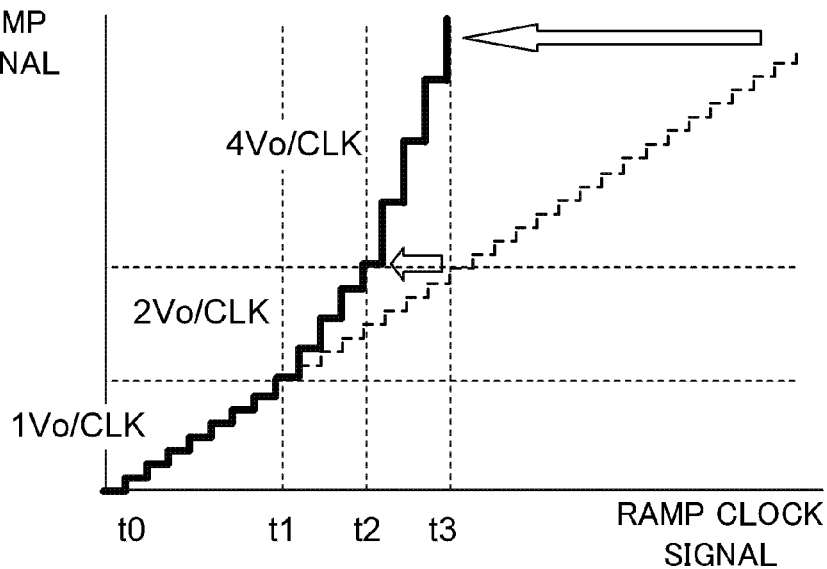
FIG. 12 is a diagram illustrating an example of slope control of a ramp wave.

In FIG. 12, at first, until the count value of the ramp clock signal CLK2 reaches time t1, the switch control method of FIG. 2 is used with the gain setting of "1" as usual, in which only 1 Vo (1 Vo=reference voltage) is changed per clock of the ramp clock signal CLK2. Next, while the count value of the ramp clock signal CLK2 is between times t1 and t2, the gain setting is changed to ½, and the switch control method of FIG. 3 or 4 is used to achieve a $2^1$ times higher change rate, which is 2 Vo per clock. The comparison error under this condition is 1 LSB, which is at or below the optical shot noise level. Moreover, while the count value of the ramp clock signal CLK2 is between times t2 and t3, the gain setting is changed to ¼, and the switch control method of FIG. 5 or 6 is used to achieve a $2^2$ times higher change rate, which is 4 Vo per clock. The comparison error under this condition is 3 LSB, which is at or below the optical shot noise level. In this way, dynamically changing the gain during A/D conversion allows an unnecessarily high accuracy, which is not detectable due to optical shot noise, to be prevented, and a situation to be created in which required accuracy for video data is only maintained. As a result, reduction in the comparison time is achieved.

Note that although the above description illustrates a three-stage change, the multistage change may be performed in any number of stages (more than one stage) as long as the quantization errors are below the optical shot noise level. In addition, as long as the quantization errors are below the optical shot noise level, the switching points of times t1, t2, t3, ... may be set in any manner.

As described above, in this embodiment, the switch control method of the plurality of switches is changed in the ramp generator circuit 31 of the reference signal generation section 35 as shown in FIGS. 2-8, thereby changing the slope of the reference ramp signal ref. When a reference ramp signal is generated in a conventional current-driven digital-to-analog converter (DAC) or voltage-driven DAC, the voltage or the current of the power supply is changed to change the slope (gain) of the reference ramp signal, thereby requiring time for the voltage or current to stabilize. This has the disadvantage in that a conversion error occurs during a transition state. On the contrary, in this embodiment, as previously described, the slope of the reference ramp signal ref is changed by changing the on-off control method of the switches SW1-SWn, thereby allowing the slope (gain) of the reference ramp signal ref to be changed only by changing the control method of the switches, without changing the voltage or the current of the power supply. This eliminates a time delay due to a change of the setting. Thus, data can be compared always with a correct reference ramp signal ref.

(Configuration of Correction Section)

Next, the correction section 90 of FIG. 11 will be described.

Typically, when the data stored in each digital memory of the counter section 60 is read, the image sensor performs white balance correction, gamma correction, luminance correction, etc. to produce optimum data for video data.

Here, in this embodiment, the slope (gain) of the reference ramp signal ref is changed in multiple stages based on the switch control method of FIGS. 2-8 during A/D conversion, presenting a problem in that the linearity of the output data is degraded. Thus, concurrently with the various corrections of color signals and brightness, linearity correction is performed on the output data by the correction section 90.

Figure 13:
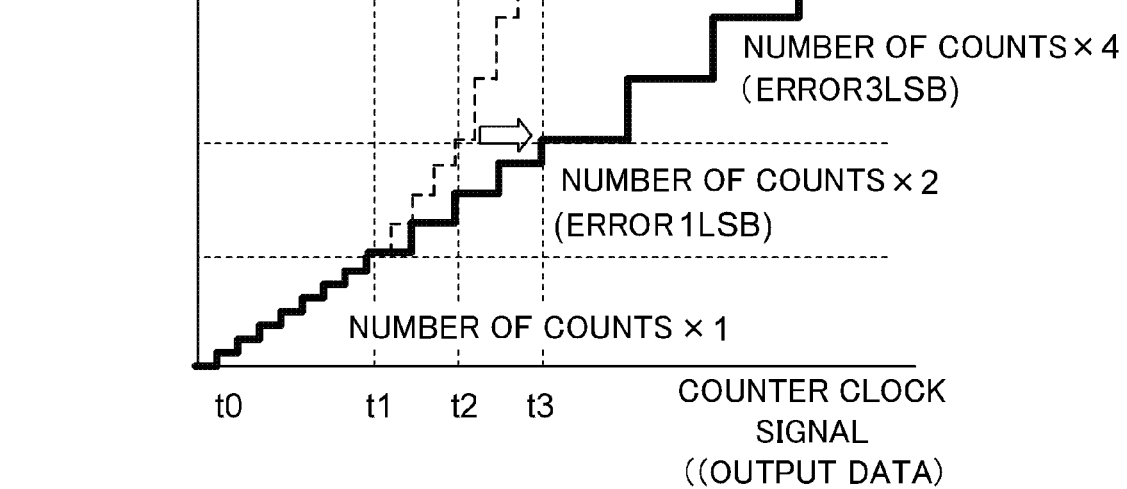
FIG. 13 is a diagram illustrating an example of linearity correction of the ramp wave shown in FIG. 12.

One example of the linearity correction is shown in FIG. 13. The correction section 90 corrects the outputs of digital memories upon a change in the slope (gain) of the reference ramp signal ref. Although one possible method would be to change the frequency of the counters at the time of data correction, correction by either software or a correction circuit after storing the data in the digital memories is preferable because frequency setting has limitations in terms of manufacturing process. However, any other method may be used as long as the configuration has a same effect.

Figure 14:
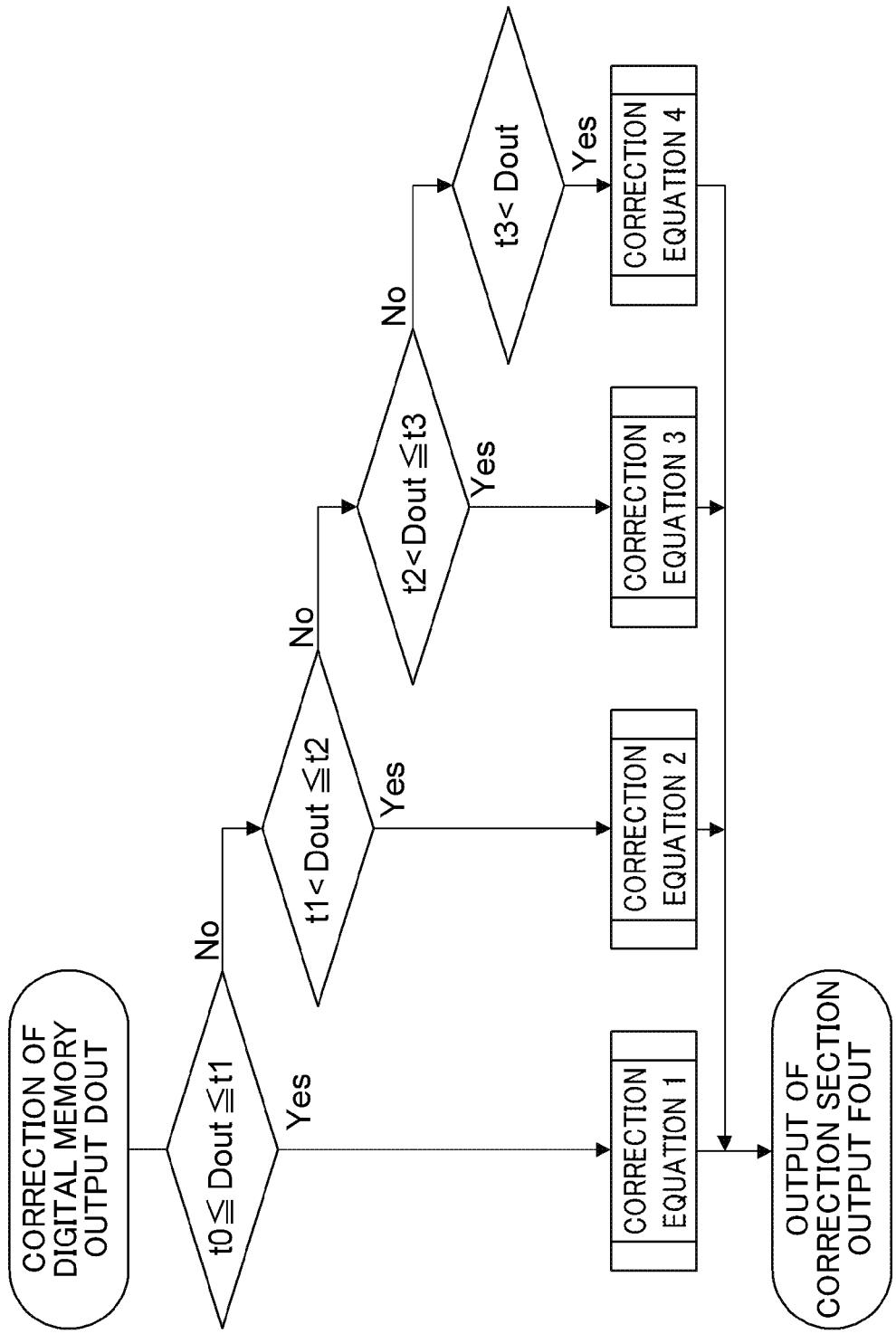
FIG. 14 is a flowchart of the linearity correction.

More specifically, since the ramp clock signal CLK2, which is input to the ramp generator circuit 31, and the counter clock signal CLK1, which is input to each counter in the counter section 60, are in a synchronous design, a change of the reference ramp signal ref and a counting operation always occur at the same time. Therefore, as shown in FIG. 14, while the count value Dout of a digital memory of the counter section 60 is between times t0 and t1, the output data is directly output as expressed by the correction equation 1 shown below because the change rate of the reference ramp signal ref is 1 Vo/CLK2; and while the count value Dout is between times t1 and t2, the output data is corrected to be a $2^1$ times higher value as expressed by the correction equation 2 shown below because the change rate of the reference ramp signal ref is 2 Vo/CLK2. Moreover, while the count value Dout is between times t2 and t3, the output data is corrected to be a $2^2$ times higher value as expressed by the correction equation 3 shown below because the change rate of the reference ramp signal ref is 4 Vo/CLK2; and after the count value Dout exceeds time t3, the output data is corrected to be a $2^3$ times higher value as expressed by the correction equation 4 shown below because the change rate of the reference ramp signal ref is 8 Vo/CLK2. This substantially reproduces the linearity of the output video data.

$$Fout = 2^0 * Dout \quad \text{Correction equation 1}$$

$$Fout = 2^1 * (Dout - t1) + 2^0 * t1 \quad \text{Correction equation 2}$$

$$Fout = 2^2 * (Dout - t2) + 2^1 * (t2 - t1) + 2^0 * t1 \quad \text{Correction equation 3}$$

$$Fout = 2^3 * (Dout - t3) + 2^2 * (t3 - t2) + 2^1 * (t2 - t1) + 2^0 * t1 \quad \text{Correction equation 4}$$

Note that the above description illustrates a three-stage correction, the multistage correction may be performed in any number of stages (more than one stage) according to the multistage change of the slope (gain) of the reference ramp signal ref. In addition, the correction may be performed concurrently with color signal and brightness corrections.

Thus, in this embodiment, the slope (gain) of the reference ramp signal ref is changed in multiple stages according to the magnitude of the reference ramp signal ref, and signal correction is performed according to the output signal. This achieves sufficient accuracy and linearity for video data and achieves reduction in A/D conversion time at the same time.

(Variation of Correction Section)

Next, a variation of the correction section 90 will be described.

The low-pass filter 40 or a capacitive element is often connected to the output of the reference signal generation section 35 in order to prevent a glitch of the reference ramp signal ref. Moreover, in a configuration where a plurality of signal processing sections, in the comparison section 50 etc., arranged in parallel in columns concurrently perform parallel processing of image signals of one line, gate capacitances and wire capacitances of hundreds or thousands of comparators of the comparison section 50 are coupled to the output side of the reference signal generation section 35. Accordingly, a significantly large delay can occur between the output of the reference signal generation section 35 and the input of the comparison section 50. That is, even if the ramp clock signal CLK2, which is input to the ramp generator circuit 31, and the counter clock signal CLK1, which is input to each counter in the counter section 60, are in a synchronous design, a time offset can occur between a comparison result of pixel data with the reference ramp signal ref actually input to the comparison section 50 and the counter clock signal CLK1.

Figure 15:
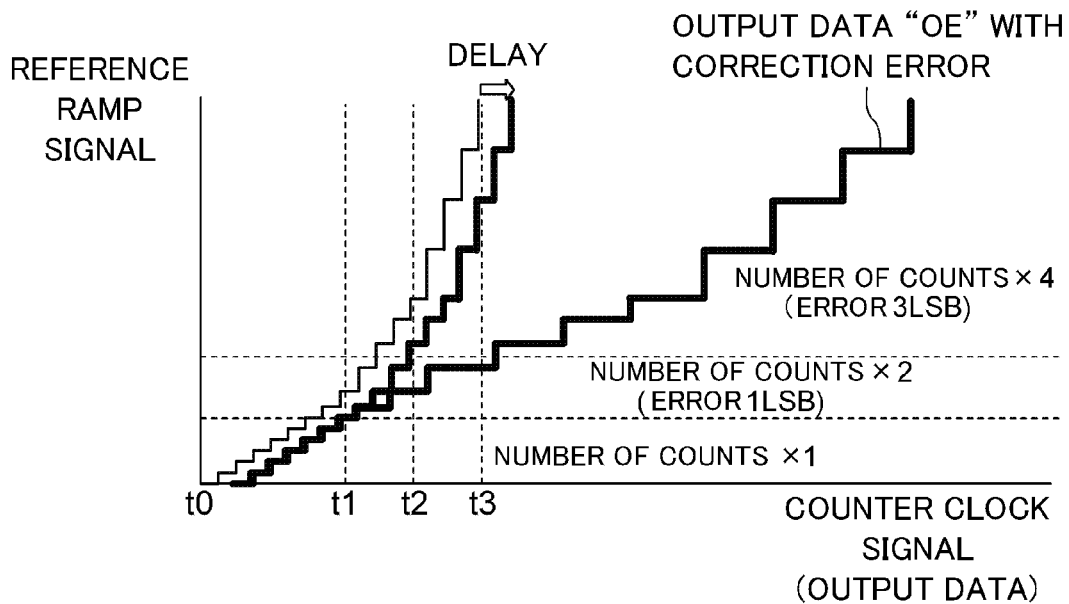
FIG. 15 is a diagram illustrating output data when a generated ramp wave includes a time delay.

If correction is performed with respect to each switching point of the preset count values t1, t2, and t3 of the counters as shown in FIG. 15 when such a delay occurs, the linearity is degraded at and near these switching points. Specifically, a part of the region in which data actually changes by 1 Vo per ramp clock signal CLK2 shifts into a period after t1 due to a delay, thus the data is corrected to be $2^1$ times by the correction section 90. As a result, the data thereafter will include an offset. Similarly, a part of the region in which data actually changes by $2^1$ Vo per ramp clock signal CLK2 shifts into a period after t2 due to a delay, thus the data is corrected to be $2^2$ times by the correction section 90. As a result, the data thereafter will have another error in addition to the previous error. Thus, if a delay of the output of the reference ramp signal ref from the reference signal generation section 35 is not taken into account, then output data Oe, with an error, having insufficient linearity for video data is output.

Figure 16:
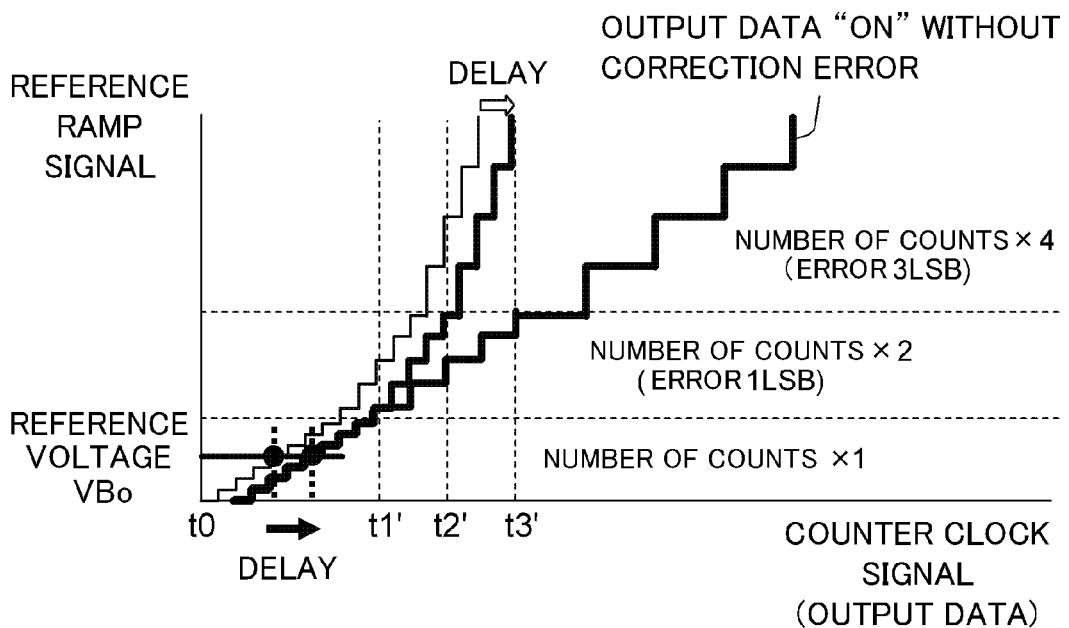
FIG. 16 is a diagram illustrating output data when the time delay is corrected.
Figure 17:
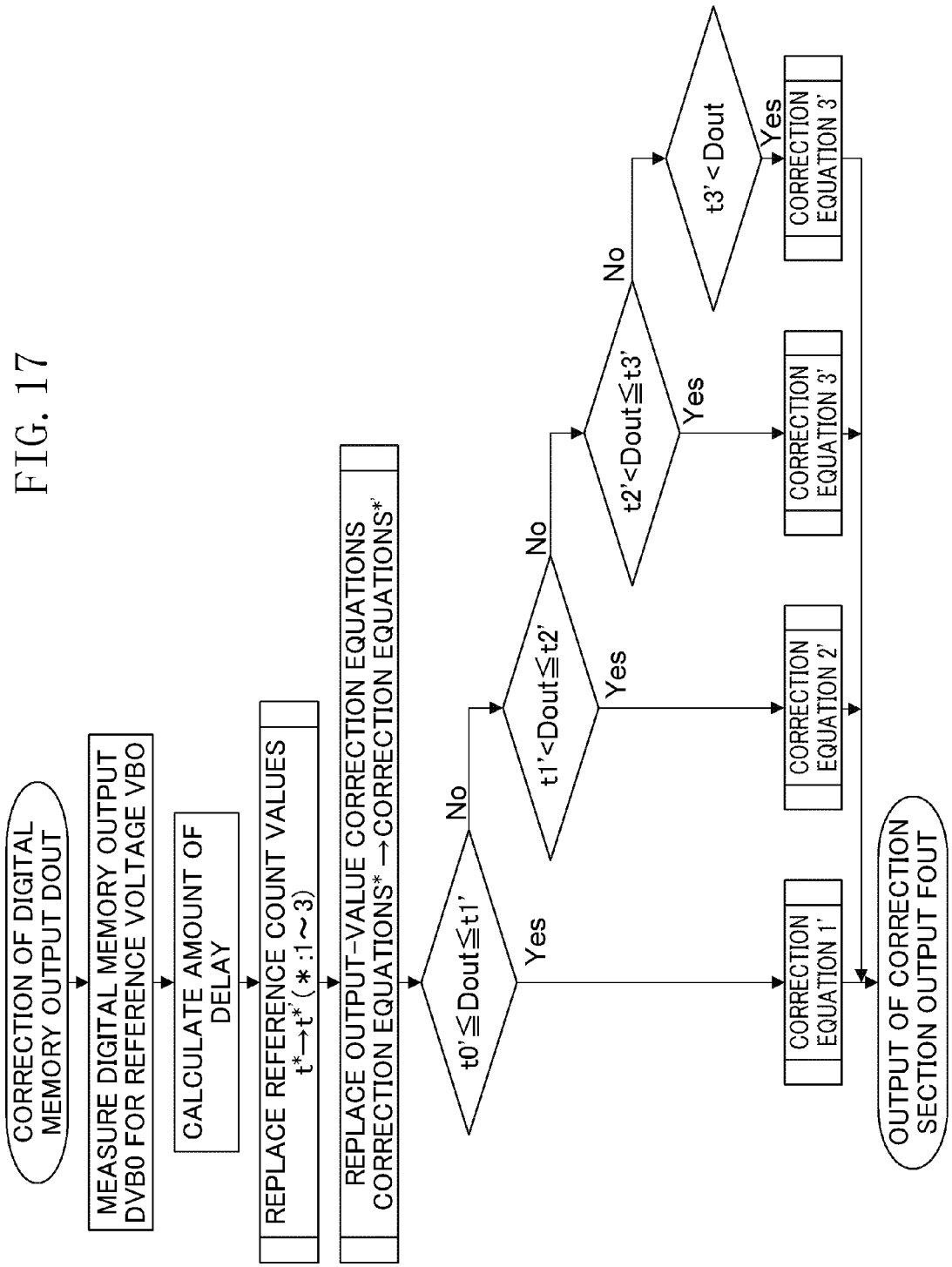
FIG. 17 is a flowchart illustrating the steps for correcting the time delay.

Therefore, in this variant, a delay measurement section 95 is provided in the correction section 90 as shown in FIG. 11. A reference voltage VBo for delay measurement is preset. Then, as shown in FIGS. 16 and 17, a count value DvB0 of each digital memory when the reference voltage VBo is reached is measured in the delay measurement section 95, and the difference between the count value DvB0, which is the actual value, and the expected value Dref at the reference voltage VBo (the count value of a digital memory without delay) is calculated as the amount of delay Ddelay, during a predetermined initialization period. Subsequently, the reference count value t1 is replaced with t1' (t=t1+Ddelay), the reference count value t2 is replaced with t2' (t2'=t2+Ddelay), and the reference count value t3 is replaced with t3' (t3'=t3+Ddelay); and the previous correction equations 1-4 are replaced with the correction equations 1'-4' shown below, respectively.

$$Fout = 2^0 * (Dout - Ddelay) + Ddelay \quad \text{Correction equation 1'}$$

$$Fout = 2^1 * (Dout - t1') + 2^0 * t1' + Ddelay \quad \text{Correction equation 2'}$$

$$Fout = 2^2 * (Dout - t2') + 2^1 * (t2' - t1') + 2^0 * (t1' - Ddelay) + Ddelay \quad \text{Correction equation 3'}$$

$$Fout = 2^3 * (Dout - t3') + 2^2 * (t3' - t2') + 2^1 * (t2' - t1') + 2^0 * (t1' - Ddelay) + Ddelay \quad \text{Correction equation 4'}$$

Thereafter, similarly to the process of FIG. 14, as shown in FIG. 17, while the count value Dout of a digital memory of the counter section 60 is between times t0 and t1 during which Dout satisfies t0≦Dout≦t1', the correction is performed based on the correction equation 1'; while Dout satisfies t1'<Dout≦t2', the correction is performed based on the correction equation 2'; while Dout satisfies t2'<Dout≦t3', the correction is performed based on the correction equation 3'; and while Dout satisfies t3'<Dout, the correction is performed based on the correction equation 4'. This produces video data "On" without correction error in which the linearity of the output video data is substantially reproduced as shown in FIG. 16.

Thus, this embodiment provides sufficient linearity and accuracy for video data, and reduces A/D conversion time at the same time. As a result, an A/D conversion circuit and an image sensor having higher speed and higher accuracy are achievable.

Note that, typically, the delay varies slightly among the plurality of comparators (varies slightly from column to column), and the delay is large between the output of the reference signal generation section 35 and the input of the comparison section 50. Accordingly, the amount of delay can be obtained by collecting data for all the columns at one time and by calculating the average during the initialization period. Since an image sensor typically has hundreds or thousands of columns of data, a stable average can be calculated all at once. This method allows the time needed to measure the delay to be reduced, thereby allowing a measurement during a preset initialization period, or by only providing additional time for a single read operation.

Figure 18:
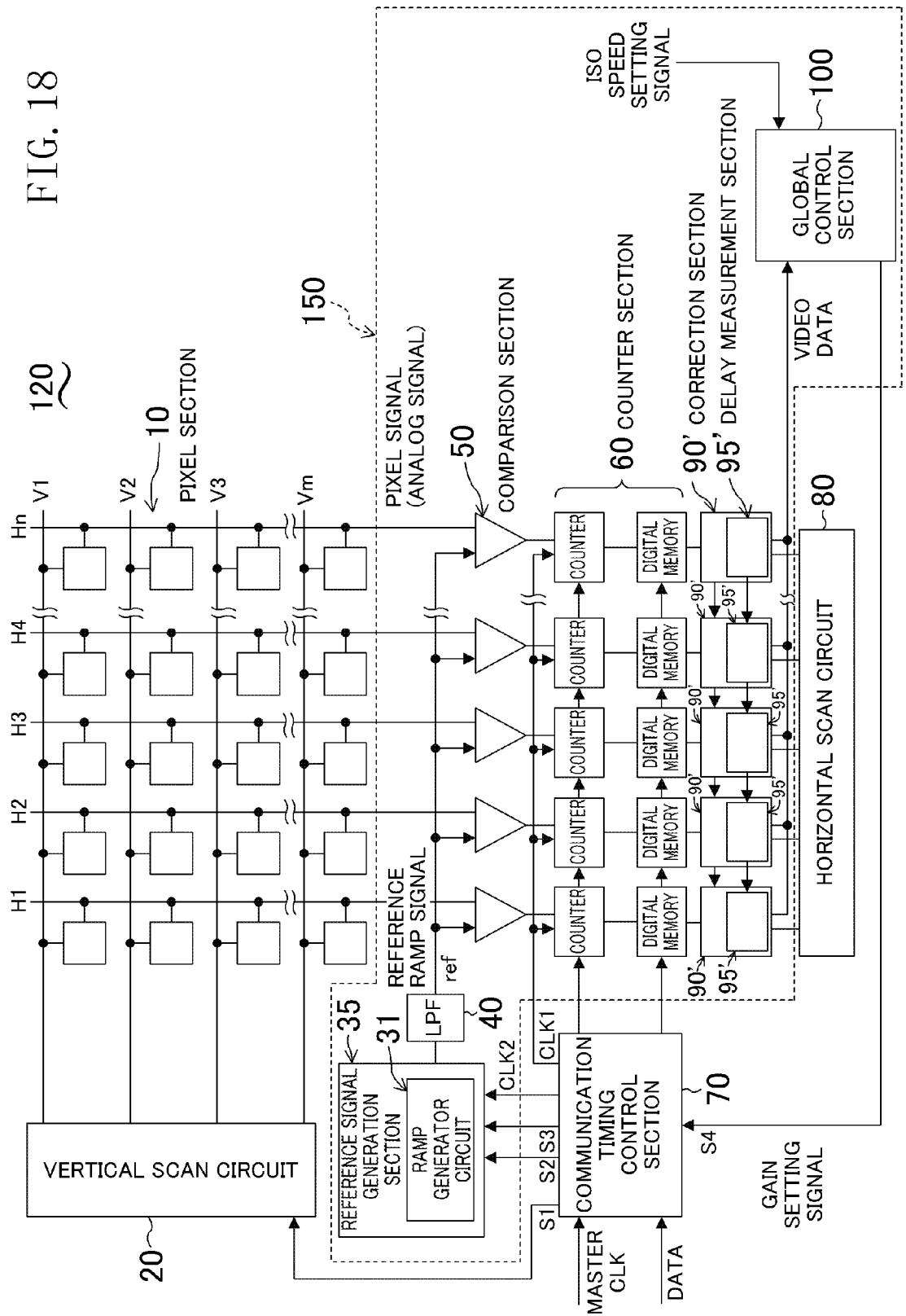
FIG. 18 is a diagram illustrating a variation in which the correction sections and the delay measurement sections are provided in respective columns.
Figure 19:
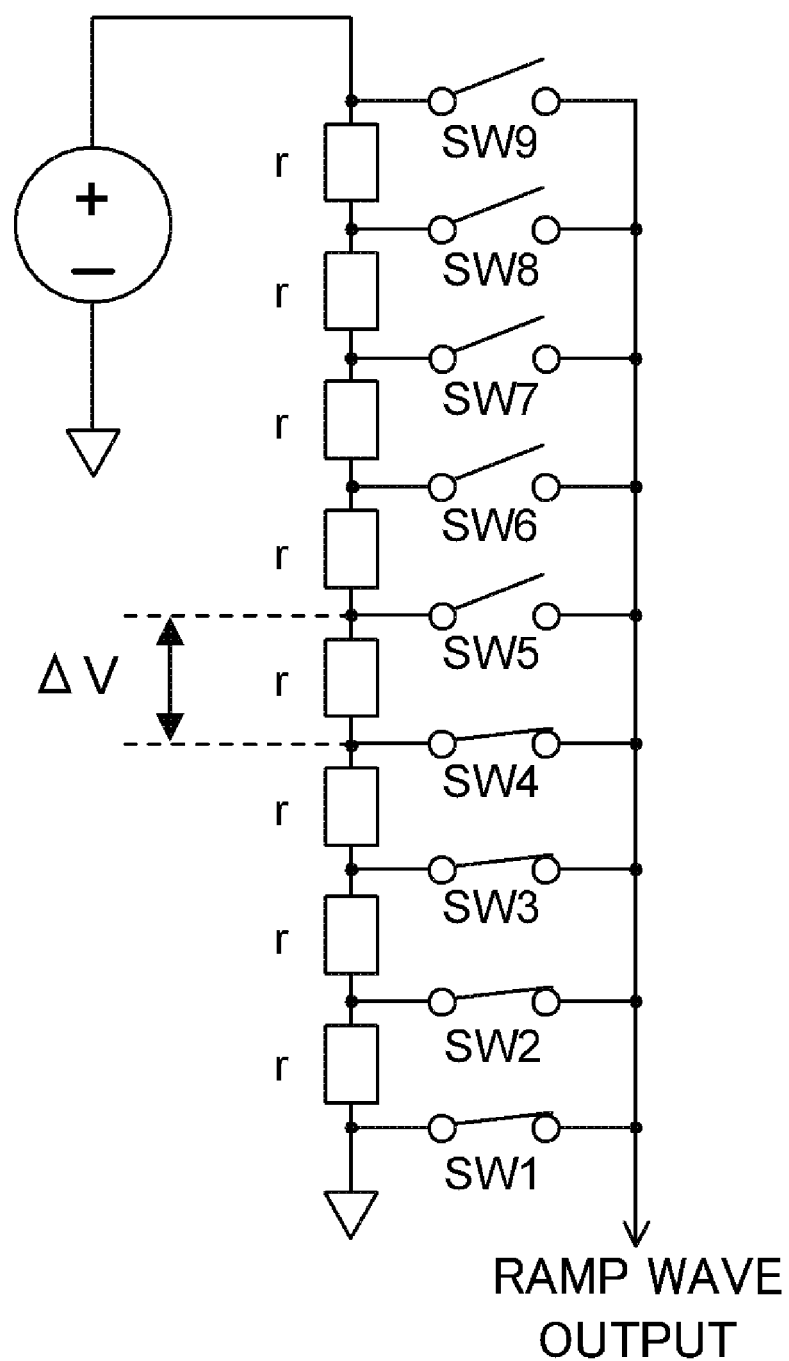
FIG. 19 is a diagram illustrating a conventional resistor-ladder voltage generator circuit.

However, if more processing time is acceptable, or if even higher accuracy is preferable, data of all the columns may be collected multiple times to calculate the average. Moreover, if the delay varies significantly from column to column, a correction section 90' and a delay measurement section 95' may be provided in each column as shown in FIG. 18.

Furthermore, if correlated double sampling (CDS) is performed to reduce offsets, a reset level is set; therefore, it is possible that this reset level is used as the reference voltage VBo, and is also used for comparison and delay measurement. This configuration has an advantage in that an initialization period does not need to be additionally provided, thus the frame rate is not affected.

As described above, according to the present invention, an increase of an A/D conversion time can be prevented even if the number of bits is increased, while securing a high accuracy of A/D conversion without increasing the numbers of resistors and switches of the resistor ladder circuit. Accordingly, the present invention is useful when applied to digital-to-analog converters, ramp generator circuits, analog-to-digital converters, and image sensors.

What is claimed is:

1. A voltage generator circuit, comprising:
a resistor ladder circuit configured to receive a predetermined voltage or a predetermined current, and to generate a plurality of reference voltages different from one another;
a plurality of switches corresponding to a plurality of taps of the resistor ladder circuit, each of which has one end connected to the tap corresponding thereto and the other end connected to an output node; and
a switch control circuit configured to control on-off states of the plurality of switches so that k (k is an integer greater than or equal to one) switches among consecutive (k+1) switches out of the plurality of switches are set to an ON state, and for switching the value of k,
wherein said switching the value of k by said switch control circuit allows for a variation of the slope of a given ramp wave.

2. A D/A converter, comprising:
the voltage generator circuit of claim 1,
wherein the switch control circuit receives a digital code and controls the on-off states of the plurality of switches according to the digital input code, and
an analog voltage output is obtained from the output node.

3. A ramp generator circuit, comprising:
the voltage generator circuit of claim 1,
wherein the switch control circuit of the voltage generator circuit switches the on-off states of the plurality of switches according to a predetermined timing signal, and
a ramp-wave output is obtained the output node.

4. An A/D converter, comprising:
a reference signal generation section configured to generate a reference signal for converting analog signals into digital signals;
a comparison section configured to compare the analog signals with the reference signal;
a counter section configured to perform a counting operation in parallel with a comparison operation in the comparison section, and to hold a count value when the output of the comparison section is inverted, in order to obtain digital signals corresponding to the analog signals; and
a correction section configured to correct an output from the counter section,
wherein the reference signal generation section includes the ramp generator circuit of claim 3, switches the value of k, and sets the slope of the reference signal in multiple stages according to the magnitude of the reference signal, and
the correction section corrects the output of the counter section according to the slope of the reference signal.

5. The A/D converter of claim 4, wherein
the correction section includes a delay measurement section configured to measure a delay from when the reference signal is output from the reference signal generation section until the reference signal is input to the comparison section, and to feed back the measured delay to the correction to the output of the counter section.

6. An image sensor system, comprising:
a pixel section, in which a plurality of pixels each having a light receiving element which outputs a signal depending on the amount of incident light are arranged in a two-dimensional matrix;
a vertical scan circuit configured to sequentially select pixels from the pixels on a line-by-line basis;
the A/D converter of claim 5 for converting an analog signal from each of the pixels to a digital signal;
a horizontal scan circuit configured to sequentially select an output of the A/D converter on a column-by-column basis; and
a communication timing control section configured to generate clock signals and control signals, and to control at least the A/D converter.

7. The image sensor system of claim 6, wherein the delay measurement section of the A/D converter measures a time for a ramp wave generated in the ramp generator circuit to reach a preset reference voltage, and calculates the delay by comparing the measured time with a reference time, during a predetermined initialization period.

8. The image sensor system of claim 7, wherein the time measurement by the delay measurement section is performed on each column of the pixel section, multiple times in total, and the times measured for the respective columns are averaged to obtain the delay.

9. The image sensor system of claim 7, wherein the time measurement by the delay measurement section is performed for all the columns of the pixel section at one time, and the times measured for all the columns are averaged to obtain the delay.

10. A method for generating a voltage in a voltage generator circuit which includes a resistor ladder circuit configured to generate a plurality of reference voltages different from one another, and a plurality of switches corresponding to a plurality of taps of the resistor ladder circuit, each of which has one end connected to the tap corresponding thereto and the other end connected to an output node, wherein on-off states of the plurality of switches are controlled so that k (k is an integer greater than or equal to one) switches among consecutive (k+1) switches out of the plurality of switches are set to an ON state, and the value of k is sequentially switched, and wherein said switching the value of k allows for a variation of the slope of a given ramp wave.

* * * * *